United States Patent
Fang et al.

(10) Patent No.: US 10,762,265 B1
(45) Date of Patent: Sep. 1, 2020

(54) HETEROGENEOUS INSTANTIATION OF HIGH-LEVEL LANGUAGE CALLABLE LIBRARY FOR HARDWARE CORE

(71) Applicant: Xilinx, Inc., San Jose, CA (US)

(72) Inventors: Zhenman Fang, Campbell, CA (US); James L. Hwang, Portola Valley, CA (US); Alfred Huang, Fremont, CA (US); Michael Gill, Campbell, CA (US); Tom Shui, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 1 day.

(21) Appl. No.: 16/189,939

(22) Filed: Nov. 13, 2018

(51) Int. Cl.
| | |
|---|---|
| *G06F 30/34* | (2020.01) |
| *G06F 8/38* | (2018.01) |
| *G06F 9/455* | (2018.01) |
| *G06F 9/54* | (2006.01) |
| *G06F 30/327* | (2020.01) |

(52) U.S. Cl.
CPC .............. *G06F 30/34* (2020.01); *G06F 8/38* (2013.01); *G06F 9/45516* (2013.01); *G06F 9/547* (2013.01); *G06F 30/327* (2020.01)

(58) Field of Classification Search
USPC .......................................................... 716/104
See application file for complete search history.

(56) References Cited

U.S. PATENT DOCUMENTS

| | | | | |
|---|---|---|---|---|
| 8,397,188 B1 * | 3/2013 | Scheidt | ............... | G06F 17/5022 703/16 |
| 8,762,916 B1 | 6/2014 | Kathail et al. | | |
| 8,775,986 B1 | 7/2014 | Mohan et al. | | |
| 9,075,624 B2 | 7/2015 | Carrillo | | |
| 9,223,921 B1 | 12/2015 | Carrillo et al. | | |
| 2006/0184905 A1 * | 8/2006 | Floyd | .................. | G06F 17/5045 716/112 |
| 2010/0131934 A1 * | 5/2010 | Kim | ........................ | G06F 8/447 717/137 |

(Continued)

OTHER PUBLICATIONS

Xilinx, "SDSoC Environment User Guide," UG1027 (v2018.1), Apr. 4, 2018, pp. 1-132, in particular pp. 99-110, Xilinx, Inc., San Jose, California, USA.

(Continued)

*Primary Examiner* — Mohammed Alam
(74) *Attorney, Agent, or Firm* — Kevin T. Cuenot

(57) ABSTRACT

Using a high-level language (HLL) callable library for multiple instances of a core includes detecting, using computer hardware, a reference to an HLL library for a core within an HLL application, determining, using the computer hardware, a plurality of instances of the core by detecting function calls within the HLL application correlated to each of the plurality of instances of the core, and generating, using the computer hardware, interface code within the HLL application for each of the plurality of instances of the core using the HLL library. An executable version of the HLL application is generated, using the computer hardware, wherein the interface code for each of the plurality of instances of the core is bound to the respective instance of the core. The function calls can specify different parameterization files corresponding to the plurality of instances of the core.

17 Claims, 11 Drawing Sheets

(56) References Cited

U.S. PATENT DOCUMENTS

2012/0005638 A1* 1/2012 Chan ................. G06F 17/5031
716/104

OTHER PUBLICATIONS

Xilinx, "SDSoC Environment User Guide," UG1027 (v2017.2), Aug. 16, 2017, pp. 1-133, in particular pp. 31-40, Xilinx, Inc., San Jose, California, USA.

Specification and drawings for U.S. Appl. No. 16/189,919, filed Nov. 13, 2018, Fang et al.

* cited by examiner

| | | | |
|---|---|---|---|
| Header File: | 502 | Select | Browse... |
| RTL Core Path: | 504 | Select | Browse... |

Accelerator Control:

| | |
|---|---|
| Protocol: | 506 ▽ |

Primary Clock:

| | |
|---|---|
| Min Clock Period (ns) | 508 |

Derived Clock(s):

| | |
|---|---|
| Clock Period Multiplier: | 510 |
| Clock Period Divisor: | 512 |

| Header file/Function | IP | Accelerator Control | Function Mapping |
|---|---|---|---|
| fir.hpp | component.xml | none | |
| 404 | | | |

FIG. 6

| Header file/Function | IP | Accelerator Control | Function Mapping |
|---|---|---|---|
| fir.hpp | component.xml | none | |
| fir | | | X=S_AXIS_DATA:in;Y=M_AXIS_DATA:out; |
| 402 | | | |

HETEROGENEOUS INSTANTIATION OF HIGH-LEVEL LANGUAGE CALLABLE LIBRARY FOR HARDWARE CORE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to using a high-level language callable library with multiple instances of a core implemented within an IC.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes programmable circuitry implemented as an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

In some cases, a programmable IC also includes an embedded processor system. The processor system can include a processor (e.g., central processing unit or "CPU") coupled to memory. The memory is capable of storing program code and/or data. The processor is capable of accessing the memory to execute the program code and operate on the data. Further, the processor system is capable of interacting with circuitry and/or other systems implemented using the programmable circuitry of the programmable IC. A programmable IC of this variety is also called a System-on-Chip (SoC).

One benefit of using an SoC is that a task that can be implemented in software, e.g., as an executable process performed by the processor system, can be offloaded to a circuit implemented in the programmable circuitry. The circuit is functionally equivalent to program code that can be executed by the processor system to perform the task. The circuit, however, often provides one or more benefits that are not attainable through execution of the program code by the processor system. The benefit(s) can include faster operation, reduced power consumption, redundancy, etc. Despite the fact that the benefits may or may not include faster operation, the circuit is often referred to as a "hardware accelerator".

Hardware accelerators are often made available to users as cores. In order to utilize a hardware accelerator, an application executed by the processor system must be able to invoke the hardware accelerator in the programmable circuitry of the SoC. Available techniques for instantiating a hardware accelerator are unable to handle complexities that arise when multiple copies of a hardware accelerator are desired, when the different copies of the hardware accelerator have different configurations, and/or when the hardware accelerator is a multi-function accelerator.

SUMMARY

In one or more embodiments, a method can include detecting, using computer hardware, a reference to a high-level language (HLL) library for a core within an HLL application, determining, using the computer hardware, a plurality of instances of the core by detecting function calls within the HLL application correlated to each of the plurality of instances of the core, and generating, using the computer hardware, interface code within the HLL application for each of the plurality of instances of the core using the HLL library. The method can also include generating, using the computer hardware, an executable version of the HLL application, wherein the interface code for each of the plurality of instances of the core is bound to the respective instance of the core.

In one or more embodiments, a system includes a processor configured to initiate operations. The operations can include detecting a reference to an HLL library for a core within an HLL application, determining a plurality of instances of the core by detecting function calls within the HLL application correlated to each of the plurality of instances of the core, and generating interface code within the HLL application for each of the plurality of instances of the core using the HLL library. The operations can also include generating an executable version of the HLL application, wherein the interface code for each of the plurality of instances of the core is bound to the respective instance of the core.

In one or more embodiments, a computer program product includes a computer readable storage medium having program code stored thereon. The program code is executable by a processor to perform operations. The operations can include detecting a reference to a high-level language (HLL) library for a core within an HLL application, determining a plurality of instances of the core by detecting function calls within the HLL application correlated to each of the plurality of instances of the core, and generating interface code within the HLL application for each of the plurality of instances of the core using the HLL library. The operations can also include generating an executable version of the HLL application, wherein the interface code for each of the plurality of instances of the core is bound to the respective instance of the core.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 5 is an example GUI that can be generated and displayed on a display device by a system as described in connection with FIG. 1.

FIG. 6 is an example GUI that can be generated and displayed on a display device by a system as described in connection with FIG. 1.

DETAILED DESCRIPTION

Figure 1:
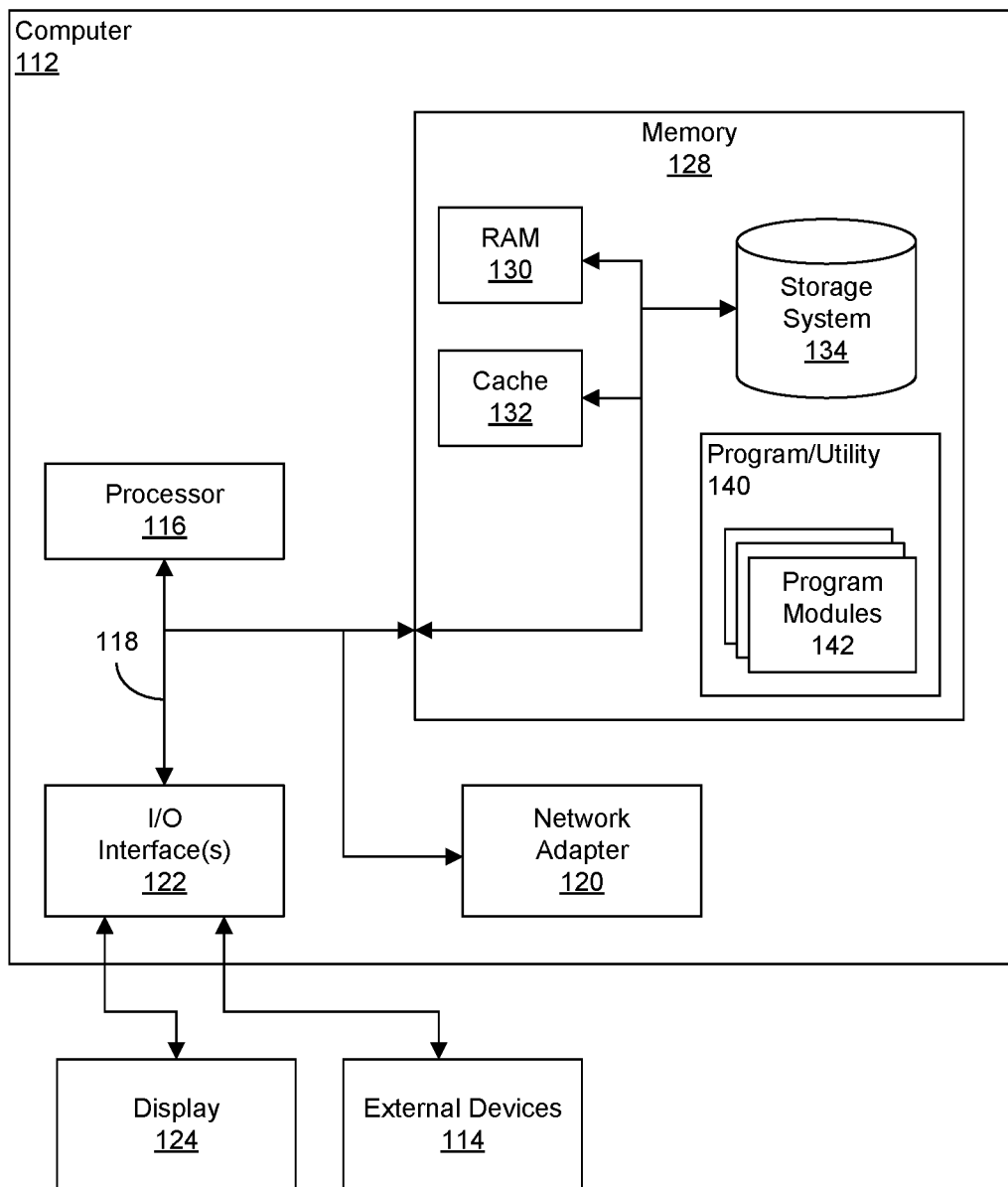
FIG. 1 illustrates an example computing system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to using a high-level language (HLL) callable library with multiple instances of a core implemented within an IC. For example, a user application can be compiled to execute in a processor system, while the core referenced by the user application can be included in a circuit design that is physically implemented in hardware, e.g., as a hardware accelerator, within an IC. The IC can be a programmable IC such as a field programmable gate array (FPGA), a dedicated application-specific integrated circuit (ASIC), or a System-on-Chip (SoC) that includes an embedded processor system and programmable circuitry. The user application is executed by a processor system, whether embedded in the IC or implemented as a separate data processing system coupled to the IC, while the hardware accelerator and/or multiple copies thereof are implemented in circuitry (e.g., the ASIC and/or programmable circuitry). In order for the user application to access the multiple instances of the core in hardware, an HLL library is needed that can be incorporated into the user's application.

In accordance with the inventive arrangements described within this disclosure, an HLL library is provided that allows an application developer to map multiple different functions in an HLL application to a single instance of a core implemented in hardware. In addition, the HLL library can be used by the user application to access two or more different instances of the core implemented in hardware. A system is capable of processing the user application to recognize the correct number of instances of the core to be implemented in hardware. The system can implement the correct number of instances of the core in hardware automatically and further ensure that the various functions included in the user application are mapped to the correct instances of the core in hardware.

In one or more other embodiments, the system is capable of implementing a delayed core configuration process. An HLL library can be generated that can be used with different instances of a core included in a circuit design. In some cases, each different instance of the same core can have a same, e.g., identical, parameterization. In other cases, each different instance of the core can have a different parameterization. Regardless of whether the different instances of the core have different parameterizations, the same HLL library generated for the core can be used for each different instance of the core implemented in hardware. Subsequent to generating the HLL library, when building the user application, different parameterizations can be specified and applied to each different instance of the core in hardware.

In general, the user's HLL application is capable of driving hardware generation. For example, the system is capable of analyzing the application, e.g., at compile time, to identify particular cores referenced in the application. The system is capable of creating a circuit design that includes the referenced cores and the correct number of instances (e.g., copies) of each such core in the circuit design. The system further is capable of generating any necessary data mover circuitry connecting the instances of the cores in hardware to the processor system. The system is capable of generating an executable version of the user's application and a placed and routed version of the circuit design that implements the core(s) utilized by the application.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a computing node 100. Computing node 100 is only one example implementation of a computing node that can be used in a standalone capacity, as part of a computing cluster, or as a cloud computing node. The example of FIG. 1 is not intended to suggest any limitation as to the scope of use or functionality of the embodiments described herein. Computing node 100 is an example of a system and/or computer hardware that is capable of performing the various operations described within this disclosure. Computing node 100, for example, is capable of creating an HLL library, compiling an application, generating a circuit design, and implementing the compiled application and circuit design in an IC. In one example, the IC has an architecture the same as or similar to the architecture described in connection with FIG. 13.

Computing node 100 includes a computer 112, which is operational with numerous other general purpose or special purpose computing system environments or configurations. Examples of computing systems, environments, and/or configurations that may be suitable for use with computer 112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer 112 can be described in the general context of computer system-executable instructions, such as program modules, being executed by a computer system. Generally, program modules can include routines, programs, objects, components, logic, data structures, and so on that perform particular tasks or implement particular abstract data types. Computer 112 can be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer 112 in computing node 100 is shown in the form of a computing device. The components of computer 112 can include, but are not limited to, one or more processors 116, a memory 128, and a bus 118 that couples various system components including memory 128 to processor 116.

Bus 118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 112 typically includes a variety of computer system readable media. Such media may be any available media that is accessible by computer 112 and can include both volatile and non-volatile media, removable and non-removable media.

Memory 128 can include computer system readable media in the form of volatile memory, such as random-access memory (RAM) 130 and/or cache memory 132. Computer 112 can also include other removable/non-removable, volatile/non-volatile computer system storage media. By way of example, storage system 134 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 118 by one or more data media interfaces. As will be further depicted and described below, memory 128 can include at least one program product having a set (e.g., at least one) of program modules that are configured to carry out the functions of embodiments of the invention.

Program/utility 140, having a set (at least one) of program modules 142, may be stored in memory 128 by way of example, and not limitation, as well as an operating system, one or more application programs, other program modules, and program data. Program modules 142 generally carry out the functions and/or methodologies of embodiments of the invention as described herein.

For example, one or more of the program modules can perform the various operations described within this disclosure including, but not limited to, generating an HLL library, generating a circuit design, compiling a user application, and/or implementing the circuit design within an IC. Program/utility 140 is executable by processor 116. Program/utility 140 and any data items used, generated, and/or operated upon by computing node 100 are functional data structures that impart functionality when employed by computing node 100. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer system/server 112 can also communicate with one or more external devices 114 such as a keyboard, a pointing device, a display 124, etc.; one or more devices that enable a user to interact with computer 112; and/or any devices (e.g., network card, modem, etc.) that enable computer 112 to communicate with one or more other computing devices. Such communication can occur via Input/Output (I/O) interfaces 122. Still yet, computer 112 can communicate with one or more networks such as a local area network (LAN), a general wide area network (WAN), and/or a public network (e.g., the Internet) via network adapter 120. As depicted, network adapter 120 communicates with the other components of computer 112 via bus 118. It should be understood that although not shown, other hardware and/or software components could be used in conjunction with computer 112. Examples, include, but are not limited to: microcode, device drivers, redundant processing units, external disk drive arrays, RAID systems, tape drives, and data archival storage systems, etc.

Figure 2:
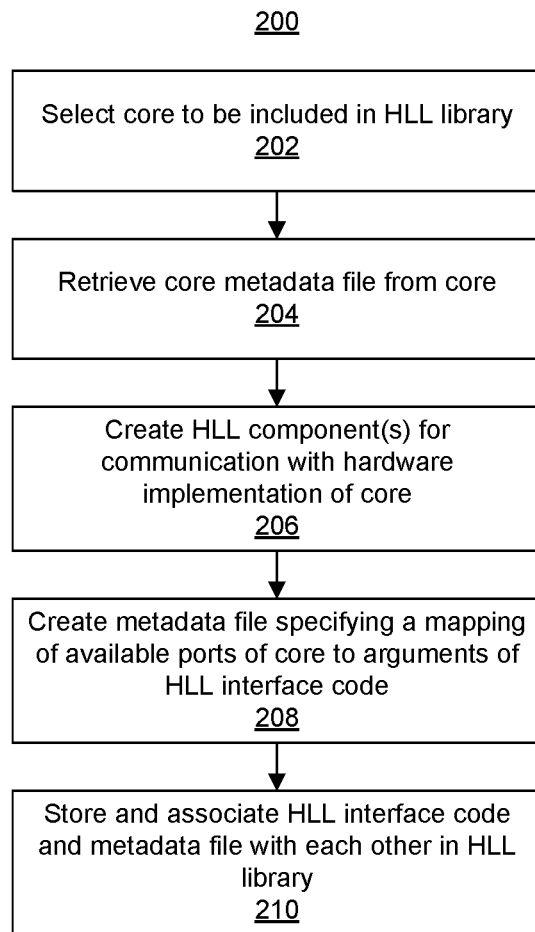
FIG. 2 illustrates an example method for generating a high-level language (HLL) library for a core.

FIG. 2 illustrates an example method 200 for generating an HLL library for a core. Method 200 can be performed by a system the same as or similar to the system described in connection with FIG. 1. In accordance with the inventive arrangements described herein, the HLL library can be used with multiple instantiations of the core in hardware. Further, the HLL library can be used with the different instantiations of the core in hardware despite one or more or all of the instantiations having a different parameterization.

In one or more embodiments, the core is specified as a package file. The package file can include a plurality of different files and file types. Further, the core can be hierarchically ordered, e.g., have an internal hierarchy or directory structure, such that additional child cores are included therein. In one example, the package file can include one or more register transfer level (RTL) source files, one or more HLL source files, one or more simulation models, and/or one or more hardened components that may be available on the IC and/or in a processor system embedded on the IC. The package file can also include one or more metadata files.

In the case where the package file includes one or more RTL source files, the RTL specifies a hardware implementation of the core. The RTL source files, for example, can be specified in a hardware description language or as a netlist. In the case where the package file includes one or more HLL source files, the HLL source files can include a header file. In another example, the HLL source files can include template files.

In one example, each metadata file specifies a description of one or more components in the core. For example, a metadata file can specify a description of RTL source file(s) in the core. For purposes of description, the metadata file(s) included in the core are referred to herein as "core metadata file(s)". For example, a core metadata file can be specified as an Extensible Markup Language (XML) file and can specify available ports of the core, parameters of the ports, and the like. In some cases, the core can include additional files such as, for example, a testbench, documentation, and/or a simulation model.

In block 202, the system selects a core to be included in the HLL library. The core, for example, specifies a hardware accelerator that is to be accessed by an HLL user application. The core can be included in a circuit design that is generated to communicate with the user application that will execute in the processor system of the target IC. In block 204, the system retrieves the core metadata file from the core.

In block 206, the system generates one or more HLL components for communication with a hardware implementation of the core. In one or more embodiments, the system generates HLL interface code templates for communication with the circuit design to be generated that will include the core. Each interface code template can specify a function having the same arguments as an HLL function call to the core. In some implementations, the body of the interface code template includes code to facilitate communication of arguments and a respective port of the circuit design. The communication code can include various parameters that can be reconfigured at compile time. For instance, parameters can be adjusted to accommodate various data lane width and/or protocols used to bridge and route signals to the circuit design.

In some other implementations, the body of the HLL interface code template is initially empty. The system is capable of generating and adding code to the body at compile time. Code that can be included in or added to the body of the interface code template is discussed in more detail in connection with FIG. 10.

In particular embodiments, each function for which an HLL interface code template is generated is determined by the system from a header file that corresponds to the core. The header file, for example, can be stored within or as part of the core. The header file can be specified in an HLL such as C++. For example, the header file can be a *.hpp file. Example 1 below illustrates an excerpt of a header file for a core. As shown, the header file declares multiple functions for the core. In this regard, the core is considered a "multi-function accelerator". In Example 1, the header file is for a core that implements a Finite Impulse Response Filter (FIR). For each function, arguments are specified and attributes of the arguments.

Example 1 typedef const char Xil_ip_param_t[ ];
define XIL_CONFIG_IP_PARAM(FILE_VAR, FILE_PATH) Xil_ip_param_t FILE_VAR=FILE_PATH
XIL_CONFIG_IP_PARAM(DEFAULT_PARAM," ");
define DEFAULT_IP 0
template<int resource_id=DEFAULT_ID, Xil_ip_param_t param_file=DEFAULT_PARAM> void fir_connetions(signed char R[ ], signed char C[ ], signed char X[ ], MYDATA Y[ ]){ }
template<int resource_id=DEFAULT_ID, Xil_ip_param_t param_file=DEFAULT_PARAM> void fir_reload(signed char H[N_CEOF]){ }
template<int resource_id=DEFAULT_ID, Xil_ip_param_t param_file=DEFAULT_PARAM> void fir_config(signed char H[1]){ }
template<int resource_id=DEFAULT_ID, Xil_ip_param_t param_file=DEFAULT_PARAM> void fir (signed char X[N_DATA], MYDATA Y[N_DATA]){ }

In Example 1, four different functions are defined for the fir core. Within this disclosure, the term "FIR filter" and "FIR core" are used interchangeably. The functions include "fir_connections", "fir_reload", "fir_config", and "fir". The "fir_reload" function reloads a set of coefficients into the hardware implementation of the core (e.g., the FIR filter). The "fir_config" function configures the hardware implementation of the core to operate using a correct set of coefficients. The "fir" function invokes the filter to operate on the provided arguments (e.g., data). By providing multiple different functions for the core, the hardware implementation of the core need not be reloaded with coefficients and/or reconfigured each time that the hardware implementation is called regardless of whether the same coefficients are to be re-used. Instead, the user's application is capable of using the "fir" function, for example, to continually call the hardware implementation of the core so long as the same coefficients are used to operate on the provided data.

In Example 1, each of the functions is defined using the template feature in C++. Within the header file, each function corresponding to the core is bound to a resource_id and a parameterization for the core specified as template arguments. The parameterization for the core is specified as a parameterization file (e.g., param_file). This convention allows the developer to specify an association or correlation between a particular instance of the core and each function for the core that is included in the HLL application.

Referring to Example 1, the system is capable of creating an HLL interface code template for each of the "fir_reload", "fir_config" and "fir" functions specified in the header file. In Example 1, the fourth function is the "fir_connections" function. In accordance with the inventive arrangements described herein, the "*_connections" function (or "connections" function) is unlike the other functions of the FIR core in that the fir_connections function is used solely to generate hardware. As such, the system does not generate an HLL interface code template for the "fir_connections" function. Similarly, the system does not compile the "fir_connections" function into executable program code. The system does not generate driver code corresponding to the "fir connection" function when building the HLL library. In effect, the "fir_connections" function is ignored for purposes of generating the executable version of the HLL application (e.g., HLL code).

As illustrated in Example 1, a connections function lists each data item that can be passed from the processor system to the hardware implementation of the core as an argument. For example, the "fir_connections" function has, as an argument, each argument included within the "fir" function, the "fir_reload" function, and the "fir_config" function. For a given core, the connections function has, as arguments, the union of the arguments of all of the functions for the core. When generating the circuit design including the core(s), the implementation tools detect the connections function for each core. In response to detecting the connections function in the HLL application, the implementation tools are capable of generating data mover circuitry in the circuit design for each argument listed in the connections function.

Example 1 also illustrates the "resource_id" template argument. The resource_id template argument is used to associate each function corresponding to the FIR core to a particular instance of the core implemented in hardware. If, for example, two different instances of the FIR core are to be implemented in hardware (e.g., instance 1 and instance 2), the resource_id can be used with the different functions as an argument to indicate which of the instances of the FIR core each function is to be bound.

In block 208, the system is capable of creating a metadata file specifying a mapping of available ports of the core to arguments of the HLL interface code. For purposes of description, the metadata file generated in block 208 is referred to herein as a "mapping metadata file". In one or more embodiments, the mapping metadata file is implemented as an XML file. In one or more embodiments, the system generates a single mapping metadata file including mapping data for a plurality of different functions of a core. In one or more other embodiments, the system generates a plurality of mapping metadata files, e.g., where each mapping metadata file corresponds to a different function.

Optionally, the system adds parameter information to the mapping metadata file indicating configuration settings to be used when creating the circuit design. The mapping metadata file specifies a mapping between the arguments of the functions of the header file (e.g., the arguments of the HLL interface code templates) and the available ports of the core. The information can indicate, for example, a name of the core, a name or reference pointer for the argument(s) of the functions; a direction of data flow (e.g., to the argument or to the port or input or output); a bus interface reference name of a port, an interface type of the port; a data width of the connection; a number of elements in an array argument; a latency estimation for the hardware implementation, and/or an estimation of resources required for the connection.

In one or more embodiments, the system is capable of automatically generating the mapping metadata file and/or guiding the user through a semi-automated procedure for generating the mapping metadata file. In one or more other embodiments, the mapping metadata file can be created by a user manually and provided to the system as an input for use in generating the HLL library.

In block 210, the system stores the HLL interface code templates with the mapping metadata file(s) in memory in association with each other to form an HLL library for the core. It should be appreciated that the system is further capable of storing the HLL library in association with the particular core or cores for which the HLL library was generated. Subsequently, when creating an HLL user application, the HLL library can be included within the user application to facilitate communication and control of one or more instances of the core implemented in hardware within the target IC.

Figure 3:
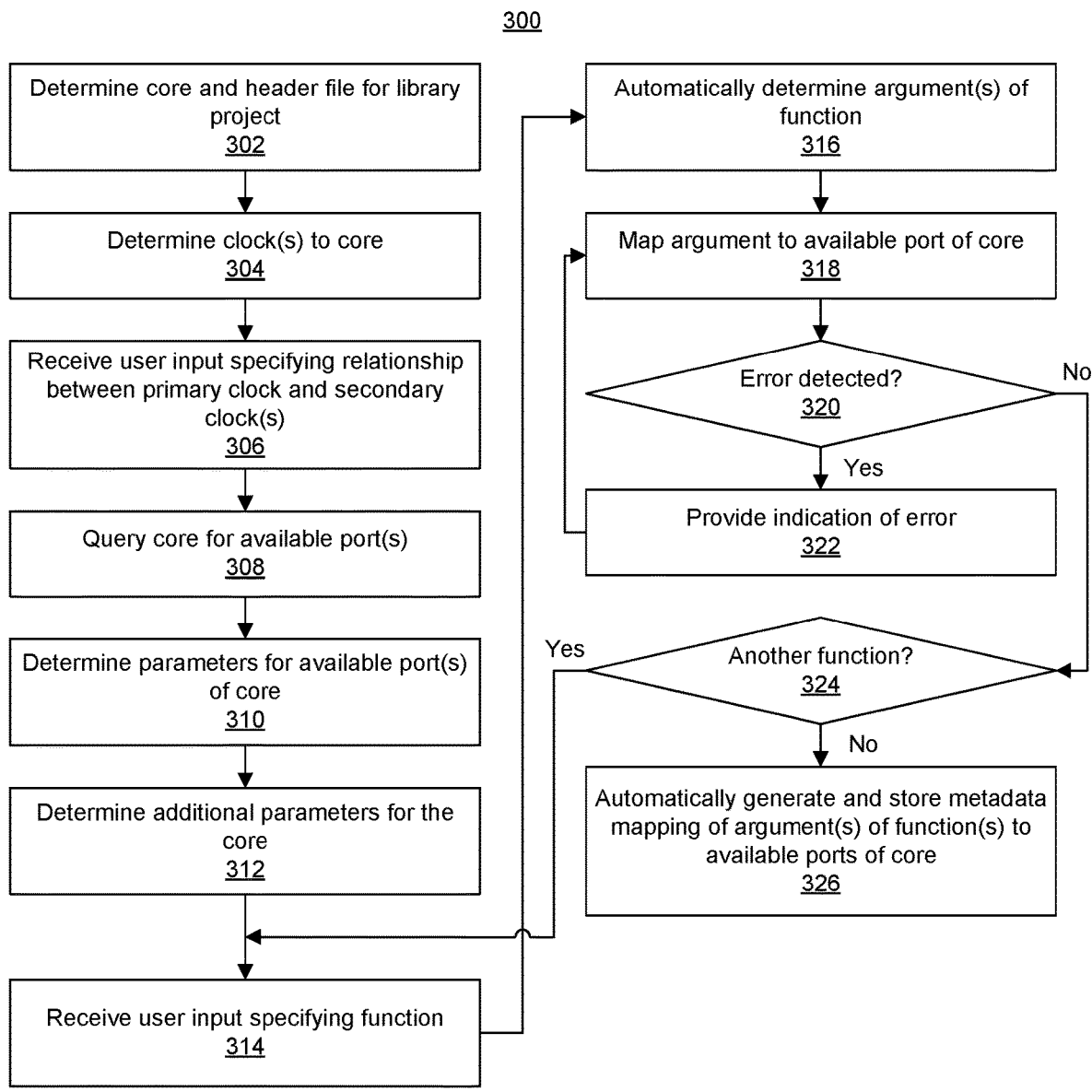
FIG. 3 illustrates an example method of generating a mapping metadata file that specifies a mapping of arguments of HLL functions to available ports of a core.

FIG. 3 illustrates an example method 300 of generating a mapping metadata file that specifies a mapping of arguments of HLL functions to available ports of a core. Method 300 can be performed by a system the same as or similar to the system described in connection with FIG. 1. In one or more embodiments, method 300 is used to implement block 208 of FIG. 2.

In block 302, the system determines a core and corresponding header file. The system, for example, is capable of receiving a user input specifying the core and the header file.

In block 304, the system is capable of automatically determining the available clock interfaces (e.g., clocks) to the core. For example, the system is capable of automatically searching the core metadata file to determine each of the clock interfaces of the core. In one or more embodiments, the system is capable of automatically determining, from the core metadata file, the primary clock of the core and/or determining a frequency of the primary clock of the core. In another example, the system is capable of receiving a user input specifying a frequency for the primary clock of the core.

In block 306, the system is capable of receiving one or more user inputs specifying a relationship between the primary clock and one or more secondary clocks of the core if, for example, the system determines that the core has one or more secondary clocks.

In block 308, the system is capable of automatically querying the core for available ports. The system, in response to determining the core for which an HLL library is to be generated, is capable of automatically searching the core metadata file to determine each of the available ports of the core specified therein. The available ports can include data input ports, data output ports, control ports (interfaces), and the like. The system, for example, is capable of searching for each port that is listed in the core metadata file of the core.

In block 308, the system is capable of querying the core metadata file. For example, the system is capable of parsing the core metadata file. In particular embodiments, the querying is performed based upon one of more user specified parameters for the core. As an illustrative and non-limiting example, as the user changes one or more parameters for the core, the changed parameters can cause a change in bit-width of the ports of the core. Example 2 below illustrates a query and a result from the query for a core when the user has not provided any parameters for the core. Example 2 uses a command line style user interface.

Example 2

Query: sdx_pack-query-interface all-ip . . . /ip/fir_compiler_v7_2/component.xml
Result: INFO: [RTL_PACK 83-0] axis interfaces:
    INFO: [RTL_PACK 83-0] interface: M_AXIS_DATA, dir: out, width: 24
    INFO: [RTL_PACK 83-0] interface: S_AXIS_CONFIG, dir: in, width: 1
    INFO: [RTL_PACK 83-0] interface: S_AXIS_DATA, dir: in, width: 16
    INFO: [RTL_PACK 83-0] interface: S_AXIS_RELOAD, dir: in, width: 1

Example 3 below illustrates a query and a result to the query in the case where the user has specified one or more parameters for the core (e.g., in lines 2-9 of Example 3). As illustrated, the results from the query directed to the same core vary due to the user specified parameters. Example 3 uses a command line style user interface.

Example 3

Query: sdx_pack-query-interface all-ip . . . /ip/fir_compiler_v7_2/component.xml\
    param DATA_Has_TLAST="Packet_Framing"\
    param M_DATA_Has_TREADY="true"\
    param Coefficient_Width="8"\
    param Data_Width="8"\
    param Quantization="Integer_Coefficients"\
    param Output_Rounding_Mode="Full_Precision"\
    param Coefficient_Reload="true"\
    param Coefficient_Structure="Non_Symmetric"
Result: INFO: [RTL_PACK 83-0] axis interfaces:
    INFO: [RTL_PACK 83-0] interface: M_AXIS_DATA, dir: out, width: 24

INFO: [RTL_PACK 83-0] interface: S_AXIS_CONFIG, dir: in, width: 8

INFO: [RTL_PACK 83-0] interface: S_AXIS_DATA, dir: in, width: 8

INFO: [RTL_PACK 83-0] interface: S_AXIS_RELOAD, dir: in, width: 8

In block 310, the system is capable of automatically determining parameters for the available ports. For example, the system is capable of searching the core metadata file to determine parameters for the available ports. The parameters can include, but are not limited to, the name of the port, the type of the port (e.g., AXI memory mapped, AXI stream or "AXIS", AXILite, etc.), data width, and direction. Examples of the parameters that can be determined for the ports are illustrated in results returned from the querying as illustrated in Examples 2 and 3.

In block 312, the system is capable of automatically determining additional parameters for the core. For example, the system is capable of determining parameters such as a register mapping for settings of the core from the core metadata file. The register mapping can include a name and an offset for particular ports or interfaces. The system is also capable of determining interrupts and parameters that can be instantiated for the core and supported circuit boards of the core.

In block 314, the system is capable of receiving a user input specifying a function of the header file. In one or more embodiments, the system is capable of presenting the user with a list of the functions found in the header file or a list of the functions specified as HLL interface code templates. As discussed, since the only uses the connections function for purposes of hardware generation, in particular embodiments the system omits the connections file from the presented list of functions. From the presented list, a user is capable of providing a user input selecting one of the presented functions.

In block 316, the system is capable of automatically determining the arguments of the function specified in block 314. For example, the system can parse the header file and locate the arguments for the specified function. As part of determining the arguments, the system determines the resource_id and the param_file template arguments. Actual values for the resource_id and the param_file template arguments are determined by the system as discussed in greater detail in connection with FIG. 9.

In block 318, the system is capable of mapping the arguments of the specified function to available ports of the core. In one or more embodiments, the system receives a user input that specifies a particular argument to be associated with one of the available ports of the core. The user, for example, may continue to provide inputs to correlate each of the arguments of the selected function to ports of the core. The system is capable, however, of assisting the user in performing the mapping by automatically determining the available ports and the arguments to be mapped to such ports.

In block 320, the system is capable of performing an error check. The error check can be performed on any mapped arguments including any manually specified mappings. In one or more embodiments, the system is capable of performing the error check by comparing attributes of the arguments, as specified in the header file and/or in the HLL interface code templates, with parameters of the available ports as determined from the core metadata file. The system, for example, is capable of comparing argument attributes such as datatype, size, and/or direction with parameters to detect incompatibilities or mismatches of the arguments of the function to the available ports of the core.

As an illustrative and nonlimiting example, in response to a user specifying a mapping of an argument of the function to a port, the system compares attributes of the argument with the parameters of the mapped port. In this example, the argument is a 32-bit integer, while the port is an 8-bit port. In this example, the system automatically generates a notification that the argument does not match the mapped port. The user can then take corrective action and avoid compilation or hardware implementation errors. The system is capable of performing error checks and determining that the user specified mapping is incorrect (e.g., mismatched) given the header file and definition of the function that is provided therein as compared to the parameters of the mapped port.

In another example, the system is capable of comparing other attributes such as the type of target IC specified by the user or the type of board specified by the user against the type of IC and/or board that the core can be used with as specified in the core metadata file. The system is capable of detecting a mismatch (e.g., a target IC or board that is not supported by the core) and providing a notification of the mismatch to the user.

In response to determining that an error is detected, method 300 continues to block 322. In response to determining that no error is detected, method 300 continues to block 324.

In block 322, the system is capable of providing an indication of the detected error. For example, the system is capable displaying a notification indicating a mismatch between an attribute of an argument and a parameter of the port to which the argument has been mapped has been detected or that another error has been detected. After block 322, method 300 can loop back to block 320 where the mismatch can be corrected whether automatically or through further user corrective user input(s).

In block 324, the system determines whether another function remains to be processed. In response to determining that another function remains to be processed, method 300 loops back to block 314. In response to determining that no further functions remain to be processed, method 300 continues to block 326.

In block 326, the system automatically generates and stores the mapping metadata file that maps the arguments of the functions to the available ports of the core. The mapping metadata file can be stored in association with the HLL interface code templates and the core as an HLL library. It should be appreciated that the system is capable of including any of the information determined and/or received in method 300 within the mapping metadata file in addition to the mapping of arguments to available ports. For example, the system is capable of adding the resource_id and/or the param_file to the mapping metadata file so that the system can utilize the resource_id and param_file data to generate corresponding hardware.

In the example of FIG. 3, the system is capable of querying the core metadata file to determine various items of information. In one or more other embodiments, the system is capable of analyzing the RTL code for the core to determine available ports and/or parameters for such ports.

Example 4 shows an example of a mapping metadata file that the system may automatically generate in accordance with the example of FIG. 3. As discussed, in other embodiments, the mapping metadata file is manually coded by the user. Example 4 illustrates a mapping of connections between HLL arguments X and Y of a function to ports S_AXIS_DATA and M_AXIS_DATA of a core.

Example 4

```
<xd:fcnMap                           xd:fcnName="fir"
    xd:componentRef="fir_compiler"
xd: resource_id="0" xd:param_file=m5
<xd:ctrlReg xd:type="none"/>
<xd:arg xd:name="X"
xd:direction="in"
xd: portlnterfaceType="axis"
xd:dataWidth="8"
xd: buslnterfaceRef="SAXIS DATA"
xd:arraySize="32"/>
<xd:arg xd:name="Y"
xd:direction="out"
xd: portlnterfaceType="axis"
xd:dataWidth="16"
xd: buslnterfaceRef="MAXISDATA"
xd:arraySize="32"/>
<xd:latencyEstimates xd:worst-case="17"
xd:average-case="17"
xd:best-case="17"/>
<xd:resourceEstimates    xd:BRAM="0"    xd:DSP="1"
    xd:FF="200" xd:LUT="200"/>
</xd: accMap>
```

As previously indicated, in some implementations, the mapping metadata file can include data indicating configuration settings for one or more parameters of the hardware implementation of the core. For example, the mapping metadata file can include a number of entries, each indicating a respective parameter name and a setting for the parameter. Example 5 shows an example entry in a metadata file that specifies settings for 7 parameters DATA_Has_TLAST, M_DATA_Has_TREADY, Coefficient_Width, Data_Width, Quantization, Output_Rounding_Mode, and Coefficient_Reload. The system is capable of automatically generating the metadata illustrated in Example 5 to specify settings for parameters based upon received user inputs. The inventive arrangements described herein are not intended to be limited to the data or formats shown in Examples 4 and 5. Rather, in other embodiments, the mapping metadata file can include other information and/or can store data in other formats.

Example 5

```
<?xml version="1.0" encoding="UTF-8"?>
<xd:component     xmlns:xd="http://www.xilinx.com/xi-
    dane"
xd:name="fircompiler">
<xd:parameter           xd:name="DATA_Has_TLAST"
    xd:value="Packet_Framing"/>
<xd:parameter     xd:name="M_DATAHas_TREADY"
    xd:value="true"/>
<xd:parameter              xd:name="Coefficient_Width"
    xd:value="8"/>
<xd:parameter xd:name="Data_Width" xd:value="8"/>
<xd:parameter                 xd:name="Quantization"
    xd:value="Integer_Coefficients"/>
<xd:parameter      xd:name="Output_Rounding_Mode"
    xd:value="Full_Precision"/>
<xd:parameter             xd:name="Coefficient_Reload"
    xd:value="true"/>
</xd:component>
```

Figure 4:
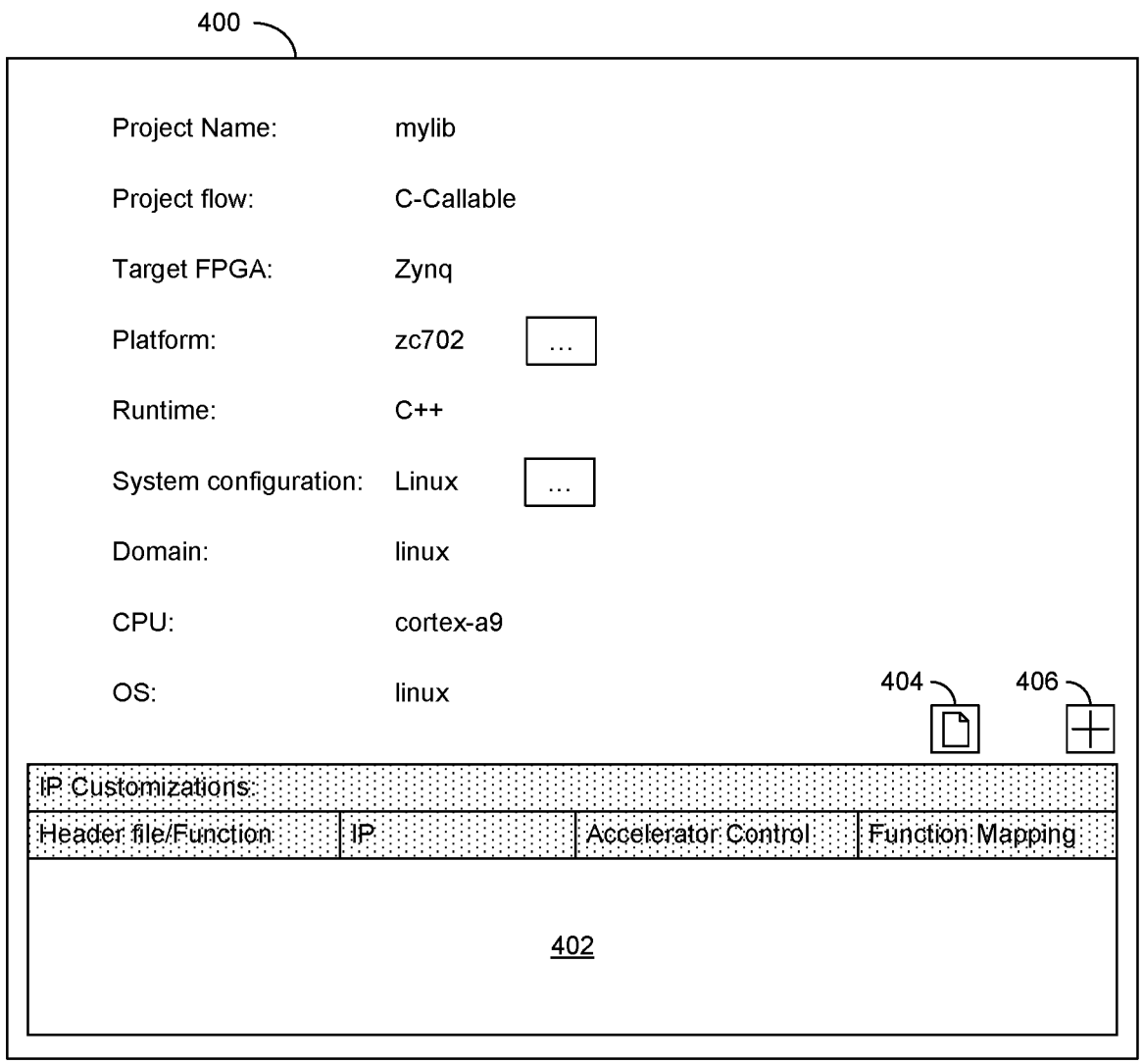
FIG. 4 is an example graphical user interface (GUI) that can be generated and displayed on a display device by a system as described in connection with FIG. 1.

FIG. 4 is an example graphical user interface (GUI) 400 that can be generated and displayed on a display device by a system the same as or similar to the system described in connection with FIG. 1. The system is capable of displaying GUI 400 as part of an automated process of generating an HLL library for a core. In the examples described within this disclosure, the core can support multiple functions.

In the example of FIG. 4, a user has launched a development application and selected options to create a project called "mylib" and designated the project as a "C-Callable" library (e.g., an HLL callable library). Further aspects of the hardware upon which the user's application will run such as the target field programmable gate array (FPGA) as "Zynq", the platform (e.g., board on which the target FPGA is located) as "zc702", the runtime of C++, the system configuration of "Linux", the domain of "linux", the CPU type (e.g., that will execute the user's application) of "cortex-a9", and the operating system of "linux" have been specified for the project.

Any customizations of cores can be specified or listed in region 402 of GUI 400. A user can initiate the customization of a core for inclusion in the user's design by selecting the add IP customization icon 404. By selecting icon 404, the user is guided through an automated process for generating an HLL library that can be used by the user's HLL application to control a core implemented in hardware. The user can later select the add function mapping icon 406 to add a function mapping for the added core.

FIG. 5 is an example GUI 500 that can be generated and displayed on a display device by a system the same as or similar to the system described in connection with FIG. 1. The system is capable of displaying GUI 500 in response to the user's selection of add icon 404.

As pictured, GUI 500 includes a plurality of different fields through which a user can enter data. Some of the fields illustrated in FIG. 5 are automatically populated by the system. For example, field 502 is capable of receiving a user input specifying a header file. For purposes of illustration, consider the case where the header file of Example 1 is specified in field 502 corresponding to an FIR filter type of hardware accelerator.

Field 504 is capable of receiving a user input specifying the core that corresponds to the header file specified in field 502. In the example of FIG. 5, the user input can specify the core metadata file for the core. The header file specified in field 502, for example, specifies functions for the particular core specified in field 504. In this example, the core supports different functions such as "fir_reload", "fir_config", and "fir" as specified in the header file indicated in field 502.

Field 506 is capable of displaying an accelerator control protocol for the core. In one or more embodiments, the system, in response to a core being specified in field 504, is capable of analyzing the core metadata file to determine whether a control protocol is specified and used for the hardware implementation of the core. An example of a control protocol is AXI4-Lite IP Interface (IPIF). The AXI4-Lite IPIF provides a point-to-point bidirectional interface to a user core. Not all cores have a control protocol. Further, other, different control protocols such a SEMI Equipment Communications Standard/Generic Equipment Model (SECS/GEM) interface can be used. In cases where the system determines that the core supports more than one different control protocol, each available control protocol is specified as a selectable option, for example, in a drop-down list available from field 506. The user is capable of selecting one of the available control interfaces. Alternatively, in response to the system determining that the core supports a single control protocol, the system can automatically populate that control protocol into field 506. In response to the system determining that the core does not use or specify a control protocol, the system displays "None" in field 506.

In one or more embodiments, the system automatically identifies the primary clock of the core and populates the minimum clock period as specified by the core metadata file in field 508. Field 508 is also capable of receiving a user input specifying a minimum clock period for the primary clock of the core. Field 506 illustrates another example where the system is capable of comparing any user provided value in field 506 with the supported clock period(s) specified in the core metadata file and indicating any mismatch as a detected error.

In some cases, cores utilize multiple different clocks. In such cases, the system makes fields 510 and 512 available through which the user can specify a relationship between the primary clock and one or more secondary (e.g., derived) clocks by indicating a clock period multiplier or a clock period divisor to be used in specifying the frequency of the secondary clock(s).

In the example of FIG. 5, a single derived clock is illustrated as being detected. It should be appreciated that some cores have more than one derived clock. In that case, the system is capable of detecting each of the derived clocks and presenting corresponding fields for the user to specify the clock period dependencies of such clocks. Still, in other cases, the core does not have any derived clocks. In the latter case, the system either excludes the derived clock section from GUI 500 or disables the section.

FIG. 6 illustrates the state of region 402 of GUI 400 after the user has specified a particular header file "fir.hpp" and a particular core by specifying core metadata file "component.xml". In this example, the FIR filter has no control protocol since "none" is specified in the column titled "Accelerator Control".

Figures 7, 8:
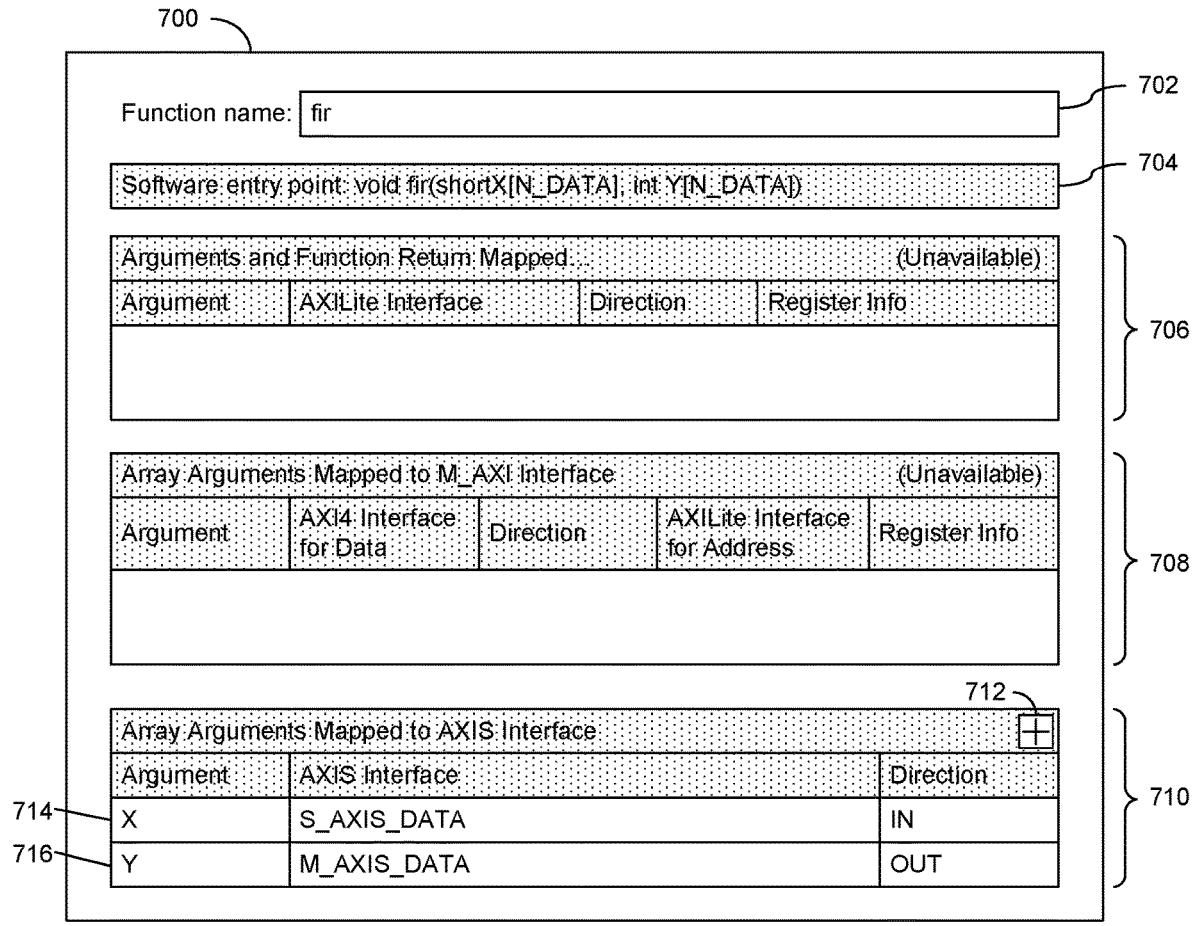
FIG. 7 is an example GUI that can be generated and displayed on a display device by a system as described in connection with FIG. 1.
FIG. 8 is an example GUI that can be generated and displayed on a display device by a system as described in connection with FIG. 1.

FIG. 7 illustrates another example GUI 700 that can be generated and displayed on a display device by a system the same as or similar to the system described in connection with FIG. 1. GUI 700 can be displayed by the system in response to a user input selecting icon 406 of FIG. 4.

GUI 700 includes a field 702 for specifying a particular function from the header file. In the example of FIG. 7, the system has parsed the header file and provided each of the functions specified therein as selectable options for field 702 (e.g., with the exception of the connections function). For example, the system is capable of identifying each function of the header file in Example 1 and presenting the function as a selectable option as part of a drop-down menu accessible from field 702.

Region 704 displays the line entry from the header file for the selected function in field 702. In this example, the user has selected the "fir" function and the entire line defining the "fir" function from the header file is displayed in region 704. Region 706 can be used to specify argument to function mappings for an AXILite interface. Region 708 can be used to specify argument to function mappings for a memory mapped AXI interface. Because the specified core does not utilize either an AXILite interface or a memory mapped AXI interface, the system has disabled (e.g., rendered unavailable) regions 706 and 708 in the example of FIG. 7.

Region 710 displays argument to port mappings for the core for an AXI stream interface, which the core does have. In the example of FIG. 7, the user has selected icon 712, which first causes a blank line 714 to be shown. In one example, the system automatically populates an argument (e.g., X) from the "fir" function in the block of line 714 beneath "Argument". The user can select the block beneath "AXIS Interface" to view a drop-down style list including each port of the core that matches the attributes of the argument. In another example, the argument is not automatically populated and instead the user selects the block beneath "Argument" in line 714 to view a drop-down style list including each argument of the selected function. The user can select an argument therefrom. In one or more other embodiments, the system allows the user to type directly into each block or field of line 714 where the system autocompletes each entry based on the available arguments, ports, and directions. Line 716 can be populated with a mapping in the same or similar manner as line 714.

FIG. 8 illustrates the state of region 402 of GUI 400 after the user has saved the information illustrated in FIG. 7. As shown, in region 402 the X argument of the "fir" function is mapped to the M_AXIS_DATA port of the core with a parameter of "in". The Y argument of the "fir" function is mapped to the "M_AXIS_DATA" port of the core with a parameter of "out".

The data provided and/or determined through FIGS. 4-8 are added or included in the mapping metadata file generated by the system. Still, FIGS. 4-8 are provided for purposes of illustration and not limitation. The different GUIs and states thereof illustrate automated querying and processing performed by the system to facilitate automatic customization of a core and automated mapping of arguments to ports of the core. In one or more other embodiments, the various operations described in connection with FIGS. 4-8 can be performed through a command line tool. Further, as discussed, the operations described can be performed automatically by the system. The system can, for example, display one or more of the GUIs of FIGS. 4-8 to allow the user to override certain automatically determined mappings. In any case, the system is capable of generating a mapping metadata file as part of an HLL library for the core. The HLL library can be incorporated into an HLL user application that calls or uses a hardware implementation of the core implemented within programmable circuitry of the target IC.

In one or more other embodiments, the mapping of arguments to ports of the core is performed manually by a user. For example, a user is capable of manually generating a metadata file that specifies the argument to port mappings and/or other information described in connection with FIGS. 3-8.

Figure 9:
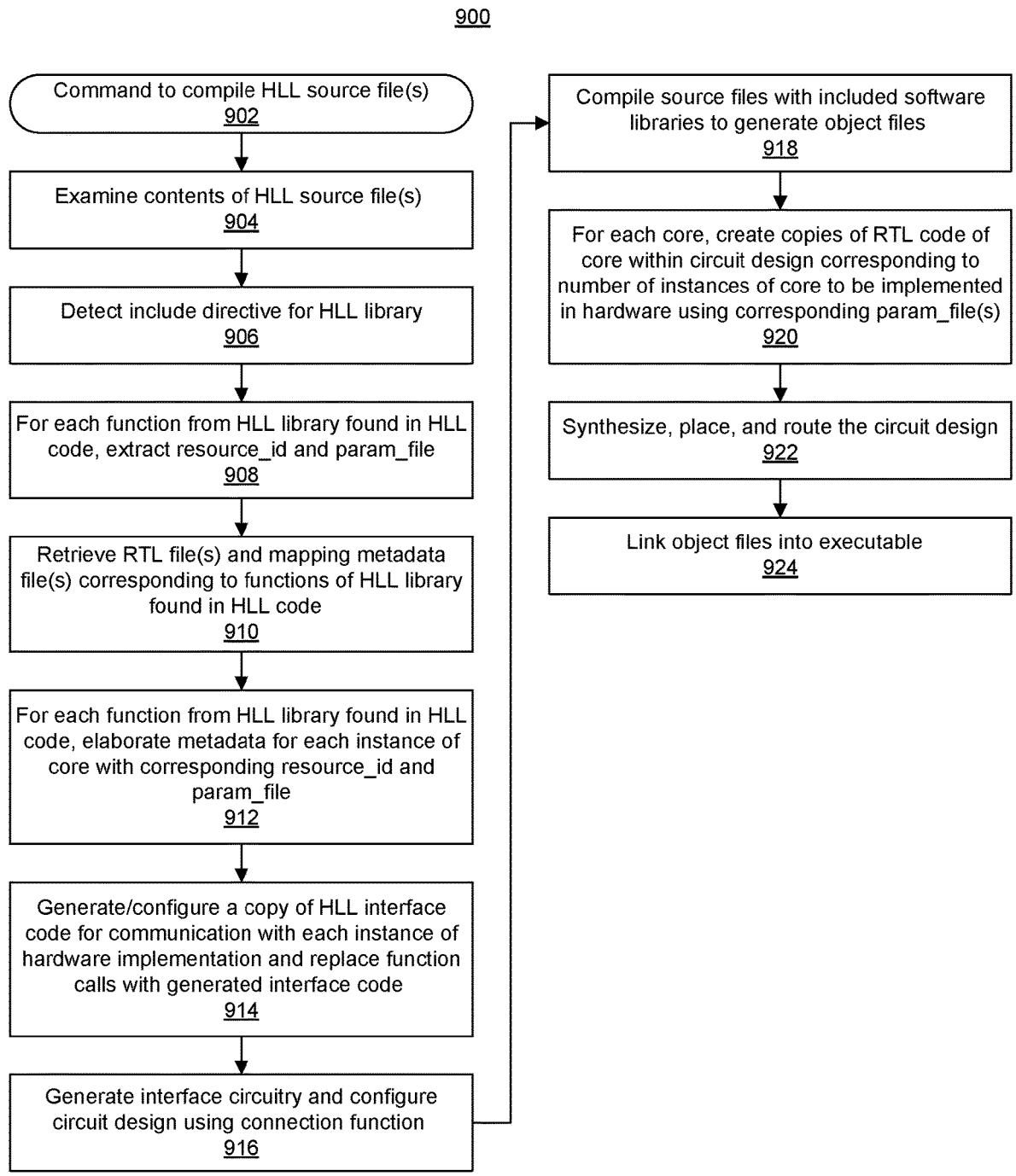
FIG. 9 illustrates an example method for compiling HLL code including a function call, from an HLL library, to a core and implementing a circuit design including the core.

FIG. 9 illustrates an example method 900 for compiling HLL code including a function call, from an HLL library, to a core. Method 900 can be performed by a system the same as or similar to the system described in connection with FIG. 1. FIG. 9 illustrates how the generated HLL library and mapping metadata file included therein are utilized to implement a user design. The terms "HLL code" and "HLL application" are used interchangeably.

Method 900 can be initiated by a command 902, received by the system, indicating one or more HLL source files to be compiled. In response to command 902 (e.g., a terminal command, an executable script command, or user input received via a GUI), the system examines the contents of the HLL source files indicated by command 902 in block 904.

Example 6 below illustrates an example of function calls included in an HLL source file of a user application for the FIR core.

Example 6 fir_connetions<1,param1>( );
fir_connections<2,param2>( );
fir_reload<1,param1>( );
fir<1,param_file1>( );
fir<2,param_file2>( );

In Example 6, the first argument within the < > specifies a particular instance of the core. The second argument specifies the file including the parameterization to be used for the specified instance of the core. The remaining arguments may be listed or specified between the ( ). As illustrated, the HLL application invokes two different instances of the FIR core. The first instance is referred to using the resource_id of "1". The second instance is referred to using the resource_id of "2". Further, in Example 6, the first instance of the FIR core is parameterized using the parameterization file called "param_file1". The second instance of the FIR core is parameterized using the parameterization file called "param_file2".

In Example 6, the first instance of the core implemented in hardware has a parameterization that can be completely different and independent of the parameterization used for the second instance of the core implemented in hardware. It should be appreciated, however, that if a same parameterization is desired for each instance of the FIR core, the same parameterization file can be specified for each instance of the core. In one or more embodiments, the parameterization file is a configuration file that specifies a list of parameters for the core. The parameters can be specified as one or more <name, value> pairs.

While the resource_id and the parameterization file can be used to specify a number of instances of a core to be implemented and bind functions and/or parameterizations to such instances, it should be appreciated that the arguments can be used in cases where a single instance of a core is used. The arguments, for example, can be specified with default values that can be maintained in cases where only a single instance of the core is desired.

The particular source code structures described within this disclosure provide several advantages over other techniques for invoking hardware accelerators from an HLL application. In one aspect, by specifying the instance of the core to which a given function corresponds as an argument, a compiler is capable of detecting, during compilation, that such a function lacks a binding to a particular instance of the core. In other techniques, for example, where the binding is specified as a pragma (e.g., a compiler directive), the lack of such a binding is not detected by the compiler during compilation. In cases where a pragma is used to bind a function to a particular instance of the core and is omitted from the HLL application, the application will compile correctly. The functions lacking the pragma, however, will be unable to access the instance of the core or possibly access the wrong instance of the core in hardware. Moreover, the error may not be found until the system is under test in hardware. As known, hardware compilation often requires many hours to complete. As such, the developer may not know until the hardware is implemented in the target IC that an error in binding functions of the HLL application occurred and that the resulting hardware includes a bug.

Another advantage of source code structures described herein is that the system is capable of using the same HLL library for the core for multiple, different instances of the core within a circuit design. Further, as noted above, each instance of the core implemented in hardware can have a different parameterization despite using the same HLL library. As such, the HLL structures described herein in connection with Examples 1 and 6 can save significant computational time and resources in that multiple HLL libraries (e.g., one for each instance) need not be created to invoke multiple different instances of a particular core while also supporting different parameterizations for each instance of the core.

In block 906, the system detects an include directive for an HLL library for a core within the HLL code (e.g., within the HLL source files). The HLL library specified by the include directive is an HLL library generated as described herein in connection with FIGS. 2 and 3 for a core.

In block 908, for each function from the HLL library for the core found in the HLL code, the system is capable of extracting, from the HLL code, the resource_id and the param_file for each such function call. For example, the system extracts the actual values of the resource_id and param_file template arguments from the HLL code. In block 910, the system is capable of retrieving the RTL file(s) and the mapping metadata file(s) corresponding to the functions of the HLL library found in the HLL code. The system is capable of creating a circuit design that includes the RTL file(s) as described in greater detail below. For example, for each function call to a core that is included in the HLL library, e.g., each call to a function from the header file as previously described herein for a core, the system retrieves the RTL source file(s) and the mapping metadata file for the core. The mapping metadata file retrieved at block 910 indicates a mapping of arguments of the HLL function call to ports of the core. In some implementations, the mapping metadata file also describes default configuration settings for the RTL source file(s).

It should be appreciated that once the RTL source file(s) and/or a mapping metadata file is retrieved for a particular core, the system need not continually retrieve the same data when different functions for the core are encountered or when functions for the core with different resource_id values are encountered if the data (e.g., RTL source file(s) and metadata) for such functions have already been retrieved. For example, after retrieving the RTL source file(s) and/or the mapping metadata file in response to detecting the "fir_config" function for a first instance of the FIR core, the system need not retrieve the same data in response to detecting the "fir_reload" or "fir" functions for the first instance of the FIR core if the RTL source file(s) and metadata already retrieved is also for the "fir_reload" and "fir" functions. Similarly, the system need not retrieve the same data when one or more of the functions of the core are detected for a second instance of the FIR filter are detected.

In block 912, for each function from the HLL library found in the HLL code, the system is capable of elaborating the metadata for each instance of the core with the corresponding resource_id and param_file. For example, for each instance of the core, the system is capable of creating a copy of the metadata retrieved in block 910 and updating the resource_id and the param_file with the correct and actual values extracted in block 908.

In block 914, the system generates a copy of the HLL interface code for communication with each instance of the core to be included in the circuit design. Each generated copy of the HLL interface code communicates data between memory locations corresponding to arguments of the function call and ports of the corresponding instance of the hardware implementation of the core specified by the RTL source file(s). The copy of the HLL interface code also synchronizes processes performed by the HLL code and the corresponding instance of the hardware implementation.

In one or more embodiments, for each copy of the HLL interface code, the system generates the HLL interface code by supplementing or configuring each HLL interface code template from the HLL library corresponding to a function call found in the source file. An example process for generation of HLL interface code is described in connection with FIG. 10. In addition, in block 914, the system replaces the function call in the HLL source code with the HLL interface code specified in the HLL code template from the HLL library. As an illustrative and nonlimiting example, in the case where the source file includes a call to "fir_reload", the system replaces the call to "fir_reload" with the HLL interface code from the HLL interface code template for "fir_reload". The system further updates the resource_id values and the parameterization file template arguments in the HLL interface code from the replaced function calls as necessary.

In performing block 914, the system is capable of generating a number of different copies of the HLL interface code that corresponds to, e.g., is equal to, the number of instances of the core to be included in the circuit design. For purposes of illustration, consider Example 6 where there are two instances of the FIR filter referenced in a source file being analyzed. In that case, the system generates two copies of the HLL interface code, e.g., one copy of the HLL interface code for each different instance of the core that is referenced in the source code. The system is capable of determining the number of instances of the core and, as such, the number of copies of the HLL code that is needed based on the number of unique resource_id values found in the source code file(s).

In block 916, the system is capable of generating interface circuitry and configuring the circuit design according to settings in the retrieved mapping metadata file. For example, the system is capable of including the RTL source file(s) in a circuit design. The system is further capable of generating interface circuitry (e.g., data mover circuits) for bridging and routing signals between arguments of the HLL interface code and corresponding ports of the instances of the core in the circuit design as mapped to the arguments per the mapping metadata file.

In one or more embodiments, the system generates the interface circuitry based on the connections function included in the HLL code. For example, for each connections function having a unique resource_id found in the HLL code for a given core, the system generates interface circuitry for each of the arguments specified by the that connections function. The generated interface circuitry (e.g., further RTL source code) is configured to communicate data using various communication protocols and/or communication circuits. For example, the interface circuit can provide hardware buffered connections for communicating data between the memory locations for the HLL arguments and corresponding or mapped ports of the circuit design.

In one or more other embodiments, the interface circuitry can include duplication circuits configured to route a single argument to multiple destinations. For instance, a duplication circuit can route data from a memory location for a first argument to a combination of other memory locations and/or ports of the circuit design. In some implementations, the routing circuitry includes a direct memory access (DMA) communication circuit configured to perform read or write data transactions initiated by either the HLL code running on a processor or by the circuit design.

The system further is capable of automatically connecting clock sources of the IC to the primary clock and a secondary clock based on the frequency for the primary clock and a specified frequency relationship between the primary clock and the secondary clock of the core.

In some conventional systems, where the "fir_connections" function is not utilized, the implementation tools generate data transfer circuitry only for those arguments of the core that are encountered in the HLL application. As an illustrative and nonlimiting example, were the HLL application to include fewer than all of the functions of the core, the HLL application would include only a subset of the arguments of the core. For example, if the HLL application includes only the "fir" function and not the "fir_reload" and the "fir_config" function, conventional implementation tools generate data mover circuitry only for the arguments included in the "fir" function. There would be no circuitry specified to convey arguments of the "fir_reload" or "fir_config" functions between the hardware implementation of the core and the processor system executing the HLL application. In consequence, after implementation, the hardware implementation of the core would exhibit erroneous or unpredictable behavior. The HLL application developer, however, would be unaware that the necessary circuitry to enable the hardware implementation of the core was not generated and, as such, not implemented in the IC. Inclusion of the connections function ensures that circuitry is created to convey each of the arguments for the core. Further, the implementation tools are configured to generate an error during compilation in the event that a connections function is not found for each core that is referenced in the HLL application.

In block 918, the system compiles the source files to generate object files. As discussed, the connections function is only used for building hardware. The connections function is not used to execute the core. As such, in one or more embodiments, the connections functions found in the source files are ignored for purposes of compilation. The system does not generate any object code corresponding to the connections functions.

In one or more embodiments, as part of compilation, the system is capable of checking syntax on the various structures found in the HLL source code. For example, the system is capable of checking that each of the functions corresponding to a given core specifies a valid resource_id (e.g., an "instance identifier") and a valid param_file as arguments. The system is capable of generating an error notification in response to determining that a function call of the HLL application corresponding to the core does not include an instance identifier as an argument or a parameterization file as an argument. In one or more other embodiments, the system is capable of checking that a connections function is included for each instance of a core referenced by the HLL source code. In response to determining that a connections file is not specified for a given instance of a core (which would result in one or more input interfaces of the core not being connected), the system is capable of generating an error notification.

In block 920, for each core, the system is capable of creating a number of copies of the RTL code of the core within the circuit design corresponding to the number of instances of the core to be implemented in hardware using the corresponding param_file(s). As discussed, the number of instances of the core implemented in hardware is determined by the number of unique values found for the resource_id parameter in the HLL code for functions corresponding to the same core. For example, for functions corresponding to the FIR filter, the system is capable of creating a number of copies of the RTL code for the FIR filter corresponding to the number of unique resource_id values found in the HLL code for any of the "fir", "fir_reload", and/or "fir_config" functions. It should be appreciated that for each copy of the RTL code of the core within the circuit design, the system also makes a copy of the interface circuitry (e.g., data mover circuitry) and connects the copy of the interface circuitry to the ports of the corresponding copy of the FIR filter.

The system is capable of elaborating the RTL code of the circuit design. The system, for example, is capable of expanding the RTL code of the circuit design to produce a fully-expanded parse tree of all module instances invoked by the HLL source code. During elaboration, the system is capable of mapping, e.g., binding, each of the plurality of functions for the FIR filter to an instance of the FIR filter. The system is capable of mapping each instance of the FIR filter to one each of the "fir" function, the "fir_reload" function, and the "fir_config" function. Per Example 6, each function will specify a particular resource_id indicating the particular instance of the core to which the function is to be bound.

As part of block 920, the system is capable of interpreting the parameterization file corresponding to each instance of the core to configure each instance of the core with the configuration data from the corresponding file. This technique allows the system to have multiple core instances with different parameterizations. The ability to specify a parameterization file on a per instance basis allows a developer to use build a single HLL library that can be used to access multiple instances of a core.

In conventional systems, each different function is interpreted as corresponding to a different instance of the FIR filter. For example, a conventional system detecting three functions as described herein (e.g., the three different functions for the FIR filter) would implement three instances of the FIR filter in the resulting circuit design and three hardware implementations of the FIR filter in the programmable circuitry, where each different function is incorrectly mapped to one instance of the FIR filter in hardware.

In block 922, the system synthesizes, places, and routes the circuit design including the RTL source files retrieved from the HLL library and the generated interface circuits to produce a set of configuration data. During synthesis, a netlist is created that specifies resources of a programmable IC to implement all of the module instances in the elaborated design. The configuration data is capable of programming programmable resources of a target programmable IC to implement the circuit designs and interface circuits.

In block 924, the system links the object files generated in block 918 into an executable. In performing the linking, the system may utilize some information generating during elaboration as performed during block 922.

Figure 10:
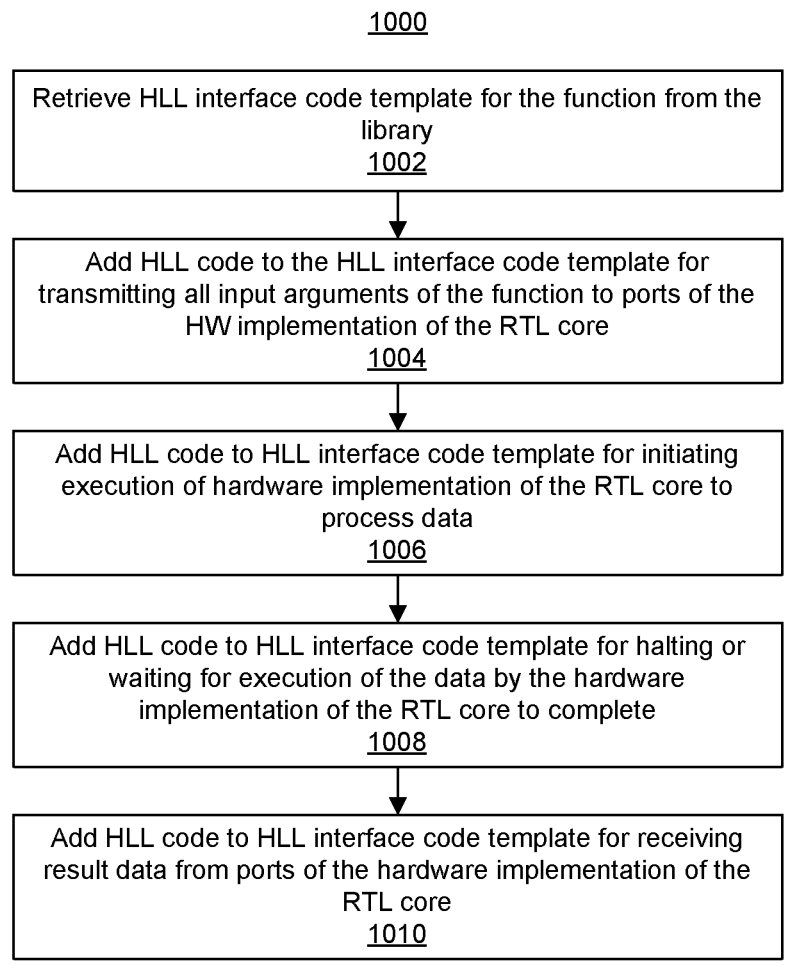
FIG. 10 illustrates an example method for generating HLL code for communication with a hardware implementation of a core.

FIG. 10 illustrates an example method 1000 for generating HLL code for communication with a hardware implementation of a core. Method 1000 can be performed by a system the same as or similar to the system described in connection with FIG. 1. In block 1002, the system retrieves an HLL interface code template for the core from the library. The HLL interface code template includes the same arguments as the HLL function call to the core.

In block 1004, the system adds HLL code to the body of the HLL interface code template. The added HLL code directs transmission of specified arguments of the HLL interface code template to the mapped ports of the hardware implementation of the core. The system uses the mapping metadata file that has been generated to direct the specified arguments of the HLL interface code to the correct ports of the circuit design.

In block 1006, the system adds HLL code to the HLL interface code template to initiate execution of the hardware implementation of the core to process data. In block 1008, the system adds HLL code to the body of the HLL interface code template to cause the HLL function to halt or wait for processing of the data by the hardware implementation of the core to complete. In block 1010, the system adds HLL code to the HLL interface code template to receive result data from ports of the hardware implementation of the core. Again, the system uses the mapping metadata file to generate correct HLL code to retrieve the result data from the correct ports of the hardware implementation of the core. In some implementations, the code generated in blocks 1004 and 1010 calls additional lower level interface code for communication with the netlist that is generated later at link time (once data sizes are resolved).

For additional information regarding generation of interface code and interface circuits and/or synthesis of HDL circuits from HLL code, reference may be made to U.S. Pat. No. 8,762,916, titled AUTOMATIC GENERATION OF A DATA TRANSFER NETWORK; U.S. Pat. No. 8,775,986, titled SOFTWARE DEBUGGING OF SYNTHESIZED HARDWARE; and U.S. Pat. No. 9,075,624, titled METHOD FOR COMPILING PROGRAMS FOR PROCESSORS WITH PROGRAMMABLE LOGIC, which are fully incorporated by reference herein.

Figure 11:
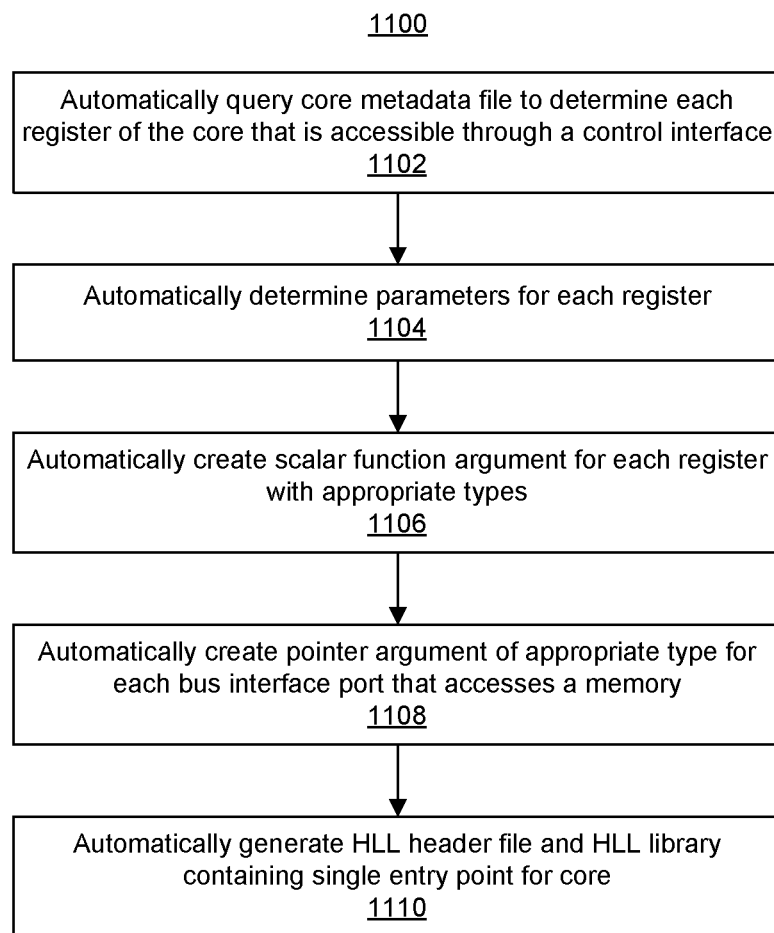
FIG. 11 illustrates another example method for generating an HLL library for a core.

FIG. 11 illustrates another example method 1100 for generating an HLL library for a core. Method 1100 can be performed by a system the same as or similar to the system described in connection with FIG. 1. In the example of FIG. 11, the system does not utilize an existing HLL component (e.g., an HLL header file or HLL interface code templates). In the example of FIG. 11, the system is capable of creating the header file automatically.

In block 1102, the system is capable of automatically querying the core metadata file of a selected core to determine each register of the core that is accessible through a control interface of the core. An example of a control interface is an AXILite slave interface specified in the core metadata file. In block 1104, the system is capable of automatically determining parameters for each register such as, e.g., bit-width, offset, and direction. In block 1106, the system creates a scalar function argument for each of the registers determined in block 1102. The scalar function arguments have appropriate types (e.g., bit-width, offset, and direction) based on the correlated register. That is, the scalar function argument generated for each register is created with the same bit-width and direction. In block 1108, the system automatically creates a pointer argument of an appropriate type for each bus interface port that accesses a memory (e.g., each stream (AXI Stream master or slave) and for each bus master (e.g., AXI4) that accesses memory). In block 1110, the system automatically generates an HLL header file and an HLL library containing a single entry point for the core specifying a mapping for each of the plurality of registers of the control interface to corresponding ones of the plurality of scalar arguments and a mapping of the pointer argument to the bus interface port.

From the single point of entry generated in the example of FIG. 11, multiple points of entry, e.g., multiple functions, can be generated. A user, for example, is capable of editing the resulting file generated in FIG. 11 to specify multiple functions based on the single point of entry. Once the multiple functions are specified, the resulting header file and may be processed as described herein to automatically create the HLL library. In this example, no header file or HLL source files (e.g., templates) are needed to initiate the automatic generation of the HLL library. The system need only access the core metadata file.

Figure 12:
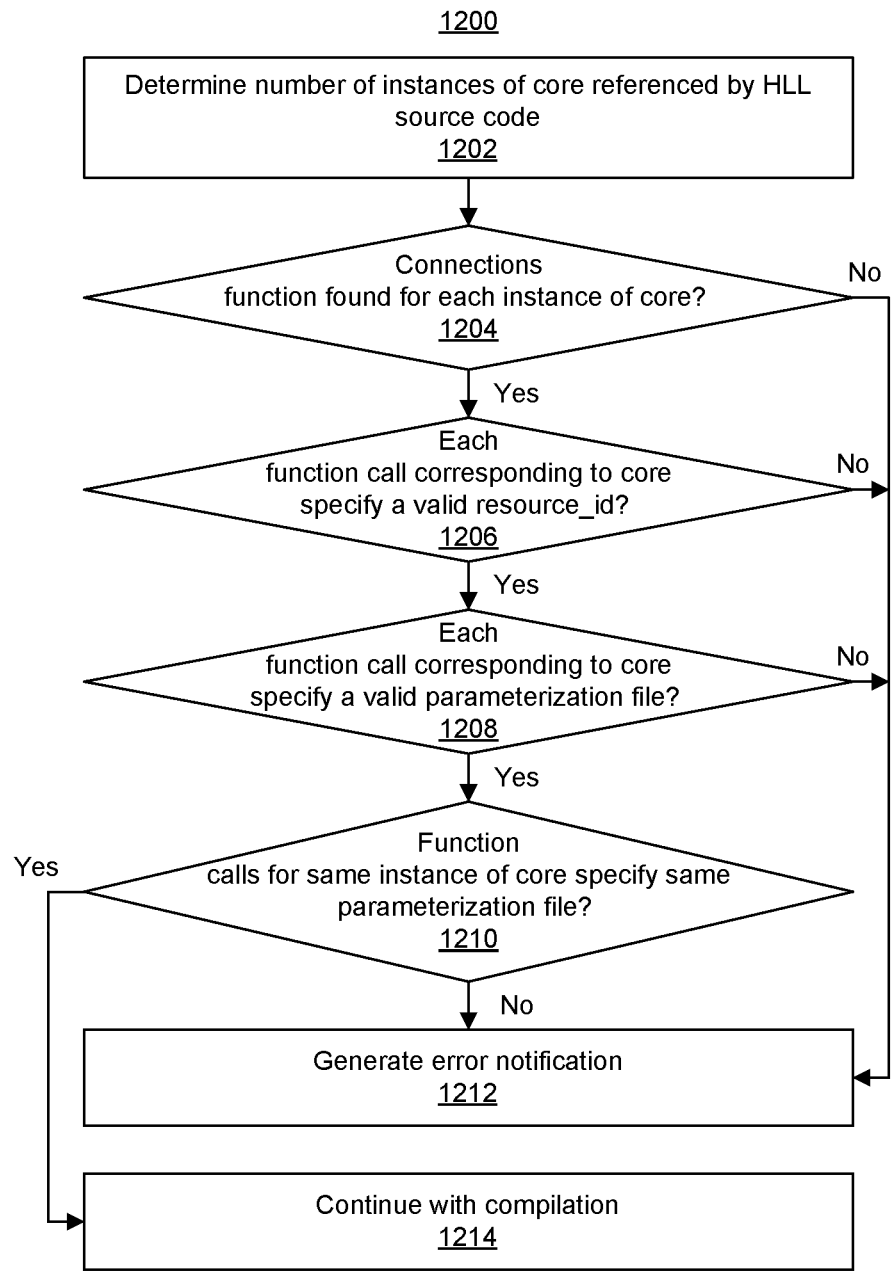
FIG. 12 illustrates an example method of checking HLL code during compilation.

FIG. 12 illustrates an example method 1200 of checking HLL source code during compilation. In one or more embodiments, a system the same as or similar to the system described herein in connection with FIG. 1 can perform method 1200 as part of block 930 of FIG. 9.

In block 1202, the system determines the number of instances of a core that are referenced by the HLL source code. The system, for example, is capable of determining the number of instances of the core by checking the number of different unique values for the resource_id template argument found in the various function calls for the core.

In block 1204, the system determines whether a connections function is found for each instance of the core. In an alternative embodiment, the system determines whether all input interfaces of each core are connected. In response to finding a connections function for each instance of the core and/or that all input interfaces for each core are connected, method 1200 continues to block 1206. In response to determining that not all input interfaces are connected (e.g., a connections function is not included in the HLL source code for each instance of the core), method 1200 continues to block 1212 where an error notification is generated and output. The notification indicates the type of error detected in the HLL source code.

In block 1206, the system determines whether each function call corresponding to the core specifies a valid resource_id. In response to determining that each function call corresponding to a core specifies a valid resource_id, method 1200 continues to block 1208. In response to determining that each function call corresponding to the core does not specify a valid resource_id, method 1200 continues to block 1212 where an error notification is generated and output. The notification indicates the type of error detected in the HLL source code.

In block 1208, the system determines whether each function call corresponding to the core specifies a valid parameterization file. In response to determining that each function call corresponding to the core specifies a valid parameterization file, method 1200 continues to block 1210. In response to determining that each function call corresponding to the core does not specify a valid parameterization file, method 1200 continues to block 1212 where an error notification is generated and output. The notification indicates the type of error detected in the HLL source code.

In block 1210, the system determines whether each function call for a same instance of the core specifies a same parameterization file. In response to determining that each function call for a same instance of the core specifies a same parameterization file, method 1200 continues to block 1214 to continue with compilation. In response to determining that each function call for a same instance of the core does not specify a same parameterization file, method 1200 continues to block 1212 where an error notification is generated and output. The notification indicates the type of error detected in the HLL source code.

Figure 13:
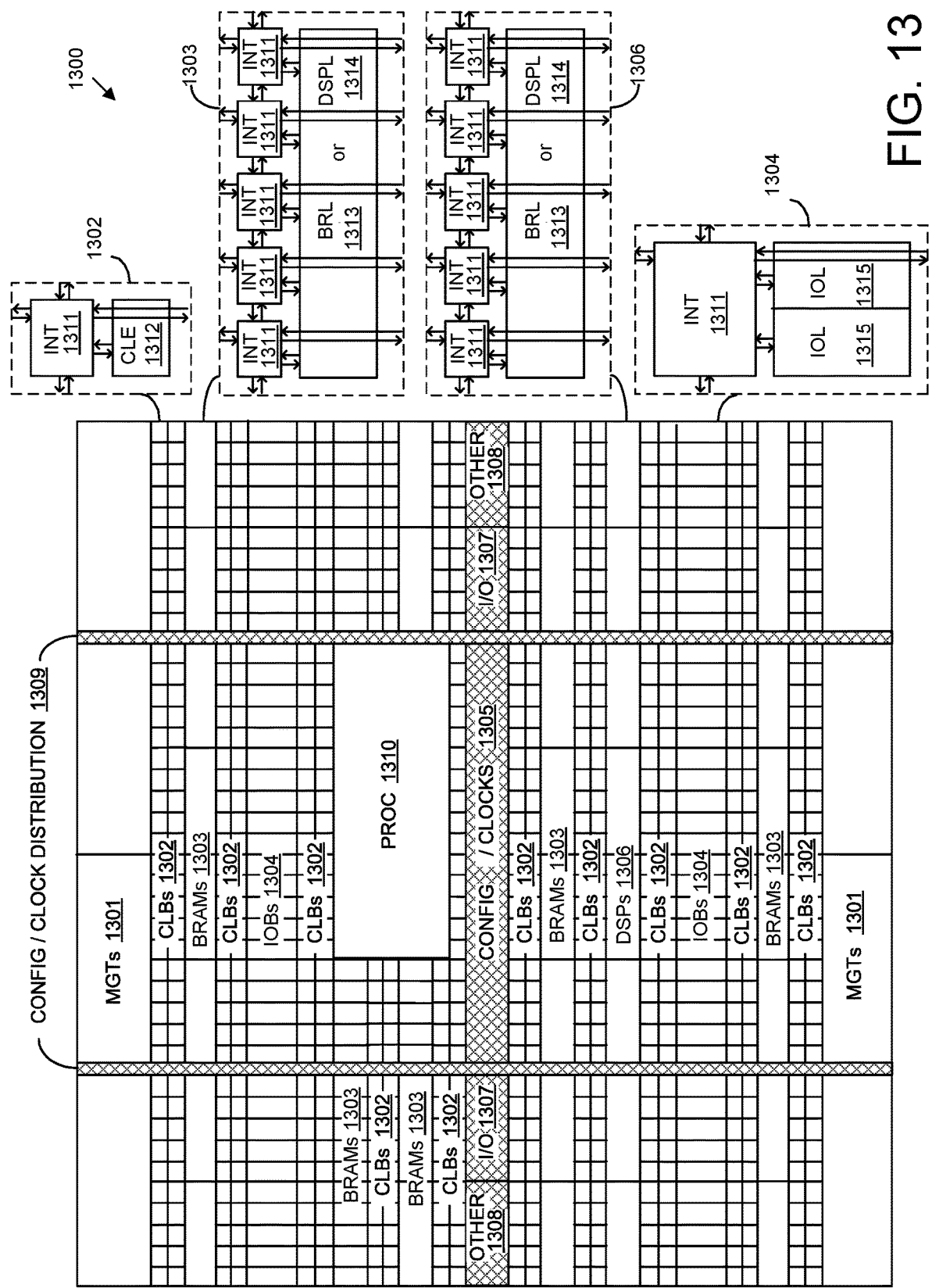
FIG. 13 illustrates an example architecture for an integrated circuit (IC).

FIG. 13 illustrates an example architecture 1300 for an IC. In one aspect, architecture 1300 can be implemented within a programmable IC. For example, architecture 1300 can be used to implement a field programmable gate array (FPGA). Architecture 1300 is also representative of a system-on-chip (SoC) type of IC. An SoC is an IC that includes a processor that executes program code and one or more other circuits. The other circuits can be implemented as hardwired circuitry, programmable circuitry, and/or a combination thereof. The circuits can operate cooperatively with one another and/or with the processor.

As shown, architecture 1300 includes several different types of programmable circuit, e.g., logic, blocks. For example, architecture 1300 can include a large number of different programmable tiles including multi-gigabit transceivers (MGTs) 1301, configurable logic blocks (CLBs) 1302, random access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the top of FIG. 13.

For example, a CLB 1302 can include a configurable logic element (CLE) 1312 that can be programmed to implement user logic plus a single INT 1311. A BRAM 1303 can include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) also can be used. A DSP tile 1306 can include a DSP logic element (DSPL) 1314 in addition to an appropriate number of INTs 1311. An IOB 1304 can include, for example, two instances of an I/O logic element (IOL) 1315 in addition to one instance of an INT 1311. The actual I/O pads connected to IOL 1315 may not be confined to the area of IOL 1315.

In the example pictured in FIG. 13, a columnar area near the center of the die, e.g., formed of regions 1305, 1307, and 1308, can be used for configuration, clock, and other control logic. Horizontal areas 1309 extending from this column can be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks can be programmable blocks and/or dedicated circuitry. For example, a processor block depicted as PROC 1310 spans several columns of CLBs and BRAMs.

In one aspect, PROC 1310 can be implemented as dedicated circuitry, e.g., as a hardwired processor, that is fabricated as part of the die that implements the programmable circuitry of the IC. PROC 1310 represents any of a variety of different processor types and/or systems ranging in complexity from an individual processor, e.g., a single core capable of executing program code, to an entire processor system having one or more cores, modules, co-processors, interfaces, or the like.

In another aspect, PROC 1310 can be omitted from architecture 1300 and replaced with one or more of the other varieties of the programmable blocks described. Further, such blocks can be utilized to form a "soft processor" in that the various blocks of programmable circuitry can be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 13 that are external to PROC 1310 such as CLBs 1302 and BRAMs 1303 are considered programmable circuitry of the IC.

In general, the functionality of programmable circuitry is not established until configuration data is loaded into the IC.

A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1310.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream can specify the circuitry that is to be implemented within the programmable circuitry and the program code that is to be executed by PROC 1310 or a soft processor. In some cases, architecture 1300 includes a dedicated configuration processor that loads the configuration bitstream to the appropriate configuration memory and/or processor memory. The dedicated configuration processor does not execute user-specified program code. In other cases, architecture 1300 can utilize PROC 1310 to receive the configuration bitstream, load the configuration bitstream into appropriate configuration memory, and/or extract program code for execution.

FIG. 13 is intended to illustrate an example architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 13 are purely illustrative. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 1310 within the IC are for purposes of illustration only and are not intended as limitations.

A system as described herein in connection with FIG. 1, for example, is capable of loading the resulting executable and the resulting configuration bitstream (placed and routed circuit design) into an IC having an architecture the same as or similar to that of FIG. 13. The processor is capable of executing the executable. The programmable circuitry physically implements the hardware accelerators (e.g., the cores and any data mover/interface circuitry to the processor) specified in the configuration bitstream. The processor, in executing the executable, is capable of controlling and/or accessing the hardware accelerator instances using the HLL library.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" means that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium includes: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures.

For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method can include detecting, using computer hardware, a reference to a high-level language (HLL) library for a core within an HLL application, determining, using the computer hardware, a plurality of instances of the core by detecting function calls within the HLL application correlated to each of the plurality of instances of the core, and generating, using the computer hardware, interface code within the HLL application for each of the plurality of instances of the core using the HLL library. The method can also include generating, using the computer hardware, an executable version of the HLL application, wherein the interface code for each of the plurality of instances of the core is bound to the respective instance of the core.

In one aspect, the method includes detecting an instance identifier for each function call corresponding to the core, wherein each instance identifier is specified as a template argument of the function call and indicates an association of the function call to a particular one of the plurality of instances of the core.

In another aspect, the method includes binding the interface code within the HLL application for each of the plurality of instances of the core to the corresponding instance of the core based on the instance identifier specified in each function call corresponding to the core.

In another aspect, the method includes generating a circuit design including a number of instances of the core corresponding to the plurality of instances of the core.

In another aspect, the method includes determining a parameterization file from the HLL application corresponding to each of the plurality of instances of the core within the circuit design and, for each of the plurality of instances of the core within the circuit design, parameterizing the instance with the parameterization file corresponding to the instance.

In another aspect, the method includes, in response to detecting a connection function within the HLL application listing each argument available for the core, generating data mover circuitry for each argument within the circuit design.

In another aspect, the connection function is used to build the data mover circuitry for each argument of the core and is omitted from the HLL library.

In another aspect, the generating the executable version of the HLL application includes generating an error notification in response to determining that a function call of the HLL application corresponding to the core does not include a valid instance identifier as a template argument or a valid parameterization file as a template argument, wherein the instance identifier specifies an association of the function call to a particular one of the plurality of instances of the core.

In another aspect, for a selected instance of the plurality of instances of the core, a plurality of different function calls corresponds to the selected instance.

In one or more embodiments, a system includes a processor configured to initiate operations. The operations can include detecting a reference to an HLL library for a core within an HLL application, determining a plurality of instances of the core by detecting function calls within the HLL application correlated to each of the plurality of instances of the core, and generating interface code within the HLL application for each of the plurality of instances of the core using the HLL library. The operations can also include generating an executable version of the HLL application, wherein the interface code for each of the plurality of instances of the core is bound to the respective instance of the core.

In one aspect, the processor is configured to initiate operations further including detecting an instance identifier for each function call corresponding to the core, wherein each instance identifier is specified as a template argument of the function call and indicates an association of the function call to a particular one of the plurality of instances of the core.

In another aspect, the processor is configured to initiate operations further including binding the interface code within the HLL application for each of the plurality of instances of the core to the corresponding instance of the core based on the instance identifier specified in each function call corresponding to the core.

In another aspect, the processor is configured to initiate operations further including generating a circuit design including a number of instances of the core corresponding to the plurality of instances of the core.

In another aspect, the processor is configured to initiate operations further including determining a parameterization file from the HLL application corresponding to each of the plurality of instances of the core within the circuit design and, for each of the plurality of instances of the core within the circuit design, parameterizing the instance with the parameterization file corresponding to the instance.

In another aspect, the processor is configured to initiate operations further including, in response to detecting a connection function within the HLL application listing each argument available for the core, generating data mover circuitry for each argument within the circuit design.

In another aspect, the connection function is used to build the data mover circuitry for each argument of the core and is omitted from the HLL library.

In another aspect, the generating the executable version of the HLL application includes generating an error notification in response to determining that a function call of the HLL application corresponding to the core does not include a valid instance identifier as a template argument or a valid parameterization file as a template argument, wherein the instance identifier specifies an association of the function call to a particular one of the plurality of instances of the core.

In another aspect, for a selected instance of the plurality of instances of the core, a plurality of different function calls corresponds to the selected instance.

In one or more embodiments, a computer program product includes a computer readable storage medium having program code stored thereon. The program code is executable by a processor to perform operations. The operations can include detecting a reference to a high-level language (HLL) library for a core within an HLL application, determining a plurality of instances of the core by detecting function calls within the HLL application correlated to each of the plurality of instances of the core, and generating interface code within the HLL application for each of the plurality of instances of the core using the HLL library. The operations can also include generating an executable version of the HLL application, wherein the interface code for each of the plurality of instances of the core is bound to the respective instance of the core.

In one aspect, the operations include detecting an instance identifier for each function call corresponding to the core, wherein each instance identifier is specified as a template argument of the function call and indicates an association of the function call to a particular one of the plurality of instances of the core.

In another aspect, the operations include binding the interface code within the HLL application for each of the plurality of instances of the core to the corresponding instance of the core based on the instance identifier specified in each function call corresponding to the core.

In another aspect, the operations include generating a circuit design including a number of instances of the core corresponding to the plurality of instances of the core.

In another aspect, the operations include determining a parameterization file from the HLL application corresponding to each of the plurality of instances of the core within the circuit design and, for each of the plurality of instances of the core within the circuit design, parameterizing the instance with the parameterization file corresponding to the instance.

In another aspect, the operations include, in response to detecting a connection function within the HLL application listing each argument available for the core, generating data mover circuitry for each argument within the circuit design.

In another aspect, the connection function is used to build the data mover circuitry for each argument of the core and is omitted from the HLL library.

In another aspect, the generating the executable version of the HLL application includes generating an error notification in response to determining that a function call of the HLL application corresponding to the core does not include a valid instance identifier as a template argument or a valid parameterization file as a template argument, wherein the instance identifier specifies an association of the function call to a particular one of the plurality of instances of the core.

In another aspect, for a selected instance of the plurality of instances of the core, a plurality of different function calls corresponds to the selected instance.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:

detecting, using computer hardware, a reference to a high-level language (HLL) library for a core within an HLL application;

determining, using the computer hardware, a plurality of instances of the core by detecting function calls within the HLL application correlated to each of the plurality of instances of the core;

detecting an instance identifier for each function call corresponding to the core, wherein each instance identifier is specified in source code of the HLL application as a template argument of the function call and indicates an association of the function call to a particular one of the plurality of instances of the core;

generating, using the computer hardware, interface code within the HLL application for each of the plurality of instances of the core using the HLL library, wherein the interface code for each instance of the core, upon execution, communicates data between memory locations corresponding to arguments of a function call to the instance of the core and ports of the instance of the core; and generating, using the computer hardware, an executable version of the HLL application, wherein the interface code for each of the plurality of instances of the core is bound to the respective instance of the core.

2. The method of claim 1, further comprising:

binding the interface code within the HLL application for each of the plurality of instances of the core to the corresponding instance of the core based on the instance identifier specified in each function call corresponding to the core.

3. The method of claim 1, further comprising:

generating a circuit design including a number of instances of the core corresponding to the plurality of instances of the core.

4. The method of claim 3, further comprising:

determining a parameterization file from the HLL application corresponding to each of the plurality of instances of the core within the circuit design; and for each of the plurality of instances of the core within the circuit design, parameterizing the instance with the parameterization file corresponding to the instance.

5. The method of claim 3, further comprising:

in response to detecting a connection function within the HLL application listing each argument available for the core, generating data mover circuitry for each argument within the circuit design.

6. The method of claim 5, wherein the connection function is used to build the data mover circuitry for each argument of the core and is omitted from the HLL library.

7. The method of claim 1, wherein the generating the executable version of the HLL application comprises:

generating an error notification in response to determining that a function call of the HLL application corresponding to the core does not include a valid instance identifier as a template argument or a valid parameterization file as a template argument, wherein the instance identifier specifies an association of the function call to a particular one of the plurality of instances of the core.

8. The method of claim 1, wherein for a selected instance of the plurality of instances of the core, a plurality of different function calls corresponds to the selected instance.

9. A system, comprising:

a processor configured to initiate operations including:

detecting a reference to a high-level language (HLL) library for a core within an HLL application;

determining a plurality of instances of the core by detecting function calls within the HLL application correlated to each of the plurality of instances of the core;

detecting an instance identifier for each function call corresponding to the core, wherein each instance identifier is specified in source code of the HLL application as a template argument of the function call and indicates an association of the function call to a particular one of the plurality of instances of the core;

generating interface code within the HLL application for each of the plurality of instances of the core using the HLL library, wherein the interface code for each instance of the core, upon execution, communicates data between memory locations corresponding to arguments of a function call to the instance of the core and ports of the instance of the core; and generating an executable version of the HLL application, wherein the interface code for each of the plurality of instances of the core is bound to the respective instance of the core.

10. The system of claim 9, wherein the processor is configured to initiate operations further comprising:

binding the interface code within the HLL application for each of the plurality of instances of the core to the corresponding instance of the core based on the instance identifier specified in each function call corresponding to the core.

11. The system of claim 9, wherein the processor is configured to initiate operations further comprising:

generating a circuit design including a number of instances of the core corresponding to the plurality of instances of the core.

12. The system of claim 11, wherein the processor is configured to initiate operations further comprising:

determining a parameterization file from the HLL application corresponding to each of the plurality of instances of the core within the circuit design; and for each of the plurality of instances of the core within the circuit design, parameterizing the instance with the parameterization file corresponding to the instance.

13. The system of claim 11, wherein the processor is configured to initiate operations further comprising:

in response to detecting a connection function within the HLL application listing each argument available for the core, generating data mover circuitry for each argument within the circuit design.

14. The system of claim 13, wherein the connection function is used to build the data mover circuitry for each argument of the core and is omitted from the HLL library.

15. The system of claim 9, wherein the generating the executable version of the HLL application comprises:

generating an error notification in response to determining that a function call of the HLL application corresponding to the core does not include a valid instance identifier as a template argument or a valid parameterization file as a template argument, wherein the instance identifier specifies an association of the function call to a particular one of the plurality of instances of the core.

16. The system of claim 9, wherein for a selected instance of the plurality of instances of the core, a plurality of different function calls corresponds to the selected instance.

17. A computer program product, comprising:

a computer readable storage medium having program code stored thereon, wherein the program code is executable by computer hardware to initiate operations including:

detecting a reference to a high-level language (HLL) library for a core within an HLL application;

determining a plurality of instances of the core by detecting function calls within the HLL application correlated to each of the plurality of instances of the core;

detecting an instance identifier for each function call corresponding to the core, wherein each instance identifier is specified in source code of the HLL application as a template argument of the function call and indicates an association of the function call to a particular one of the plurality of instances of the core;

generating interface code within the HLL application for each of the plurality of instances of the core using the HLL library, wherein the interface code for each instance of the core, upon execution, communicates data between memory locations corresponding to arguments of a function call to the instance of the core and ports of the instance of the core; and generating an executable version of the HLL application, wherein the interface code for each of the plurality of instances of the core is bound to the respective instance of the core.

* * * * *